(12) United States Patent
Li et al.

(10) Patent No.: US 10,579,565 B2
(45) Date of Patent: Mar. 3, 2020

(54) DETECTION CONTROL DEVICE

(71) Applicant: Shanghai Zhaoxin Semiconductor Co., Ltd., Shanghai (CN)

(72) Inventors: Tao Li, Beijing (CN); Jian Li, Beijing (CN); Zhiqiang Hui, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 47 days.

(21) Appl. No.: 16/145,613

(22) Filed: Sep. 28, 2018

(65) Prior Publication Data

US 2019/0340144 A1 Nov. 7, 2019

(30) Foreign Application Priority Data

May 3, 2018 (CN) .......................... 2018 1 0414303

(51) Int. Cl.
*G06F 13/38* (2006.01)
*G06F 13/40* (2006.01)
*H01R 13/26* (2006.01)
*H03K 19/00* (2006.01)
*G06F 13/42* (2006.01)

(52) U.S. Cl.
CPC ........ *G06F 13/385* (2013.01); *G06F 13/4072* (2013.01); *H01R 13/26* (2013.01); *H03K 19/0002* (2013.01); *G06F 13/4282* (2013.01); *G06F 2213/0042* (2013.01)

(58) Field of Classification Search
None
See application file for complete search history.

(56) References Cited

FOREIGN PATENT DOCUMENTS

CN        105187082 A    12/2015

*Primary Examiner* — Scott C Sun
(74) *Attorney, Agent, or Firm* — McClure, Qualey & Rodack, LLP

(57) ABSTRACT

A detection control device including a USB connection port, a first detection circuit, a second detection circuit, a control circuit, a first switching circuit and a second switching circuit is provided. When a first pin group of the USB connection port is coupled to an external device, the first detection circuit generates a first detection signal according to a first time constant. When a second pin group of the USB connection port is coupled to the external device, the second detection circuit generates a second detection signal according to a second time constant. The control circuit generates a first control signal and a second control signal according to the first and second detection signals. Each of the first and second switching circuits communicates with the external device via the first or second pin groups according to either the first control signal or the second control signal.

20 Claims, 8 Drawing Sheets

DETECTION CONTROL DEVICE

CROSS REFERENCE TO RELATED APPLICATION

This application claims the priority benefit of China patent Application No. 201810414303.6, filed on May 3, 2018. The entirety of the above-mentioned patent application is hereby incorporated by reference herein and made a part of this specification.

BACKGROUND OF THE INVENTION

Field of the Invention

The invention relates to an electronic device, and more particularly to a detection control device for detecting an external device.

Description of the Related Art

With the development of the computer and peripheral equipment industries, the Universal Serial Bus (USB) interface has become one of the most important interfaces for communication and data transmission between computers and peripheral equipment. As technology advances, high-speed transmission has become a trend, and there is a need to develop electrical connectors capable of high speed transmission.

BRIEF SUMMARY OF THE INVENTION

To increase the efficiency and convenience of data transmission, the disclosure discloses an electric connector. The electric connector comprises a detection control device. The detection control device uses simple circuits to quickly and accurately determine whether an external device is normally or reversely inserted into the electric connector according to two detection circuits.

In accordance with one embodiment of the present invention, a detection control device comprises a USB connection port, a first detection circuit, a second detection circuit, a control circuit, a first switching circuit and a second switching circuit. The USB connection port comprises a first pin group and a second pin group. The first detection circuit has a first time constant. When the first pin group is coupled to an external device, the first detection circuit generates a first detection signal according to the first time constant. The second detection circuit has a second time constant. When the second pin group is coupled to the external device, the second detection circuit generates a second detection signal according to the second time constant. The control circuit generates a first control signal and a second control signal according to the first and second detection signals. The first switching circuit determines whether to communicate with the external device via the first pin group according to the first control signal. The second switching circuit determines whether to communicate with the external device via the second pin group according to the second control signal.

BRIEF DESCRIPTION OF THE DRAWINGS

The present invention can be more fully understood by referring to the following detailed description and examples with references made to the accompanying drawings, wherein.

DETAILED DESCRIPTION OF THE INVENTION

Figure 1A:
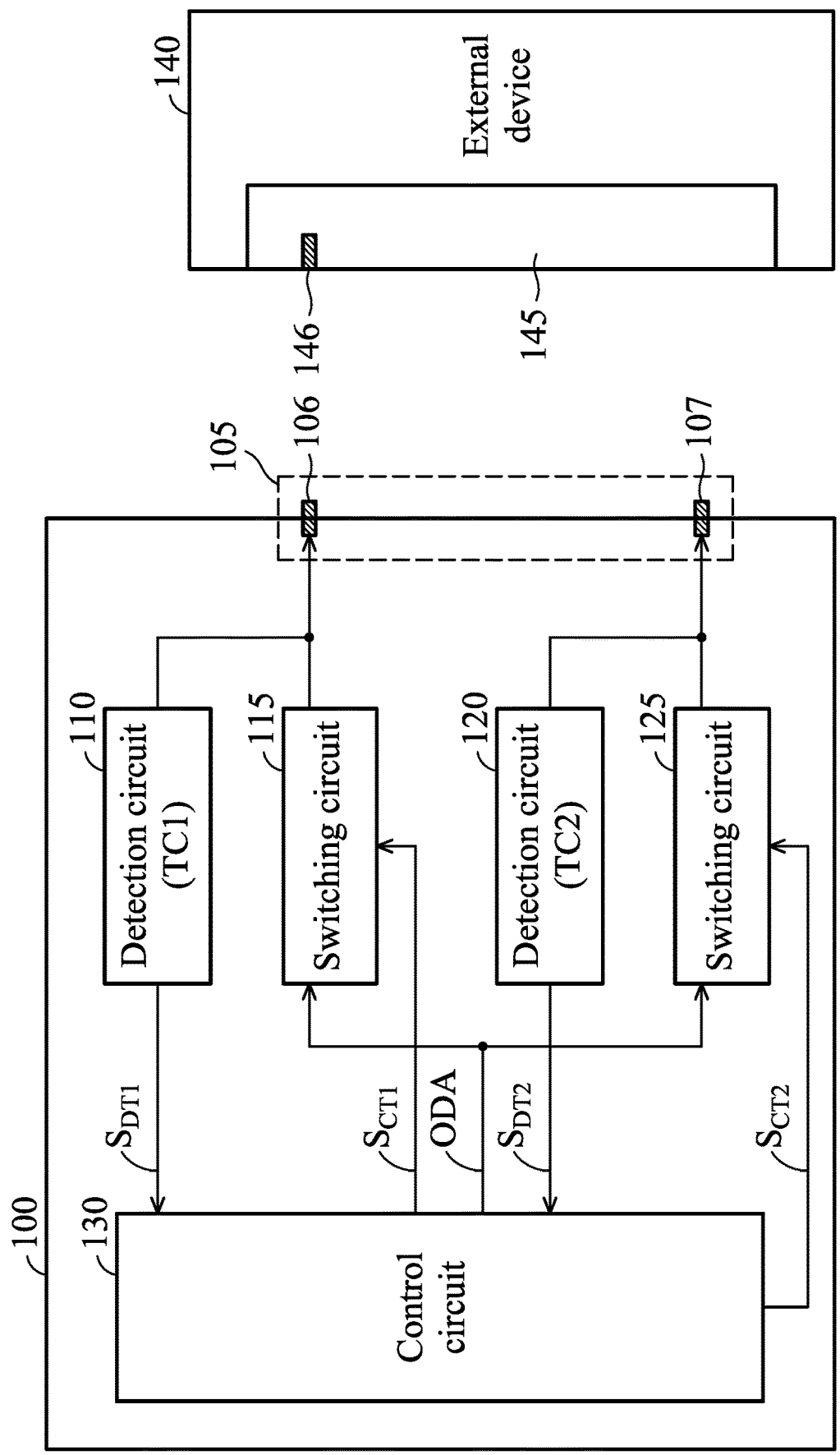
FIG. 1A is a schematic diagram of an exemplary embodiment of a detection control device according to various aspects of the present invention.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1B:
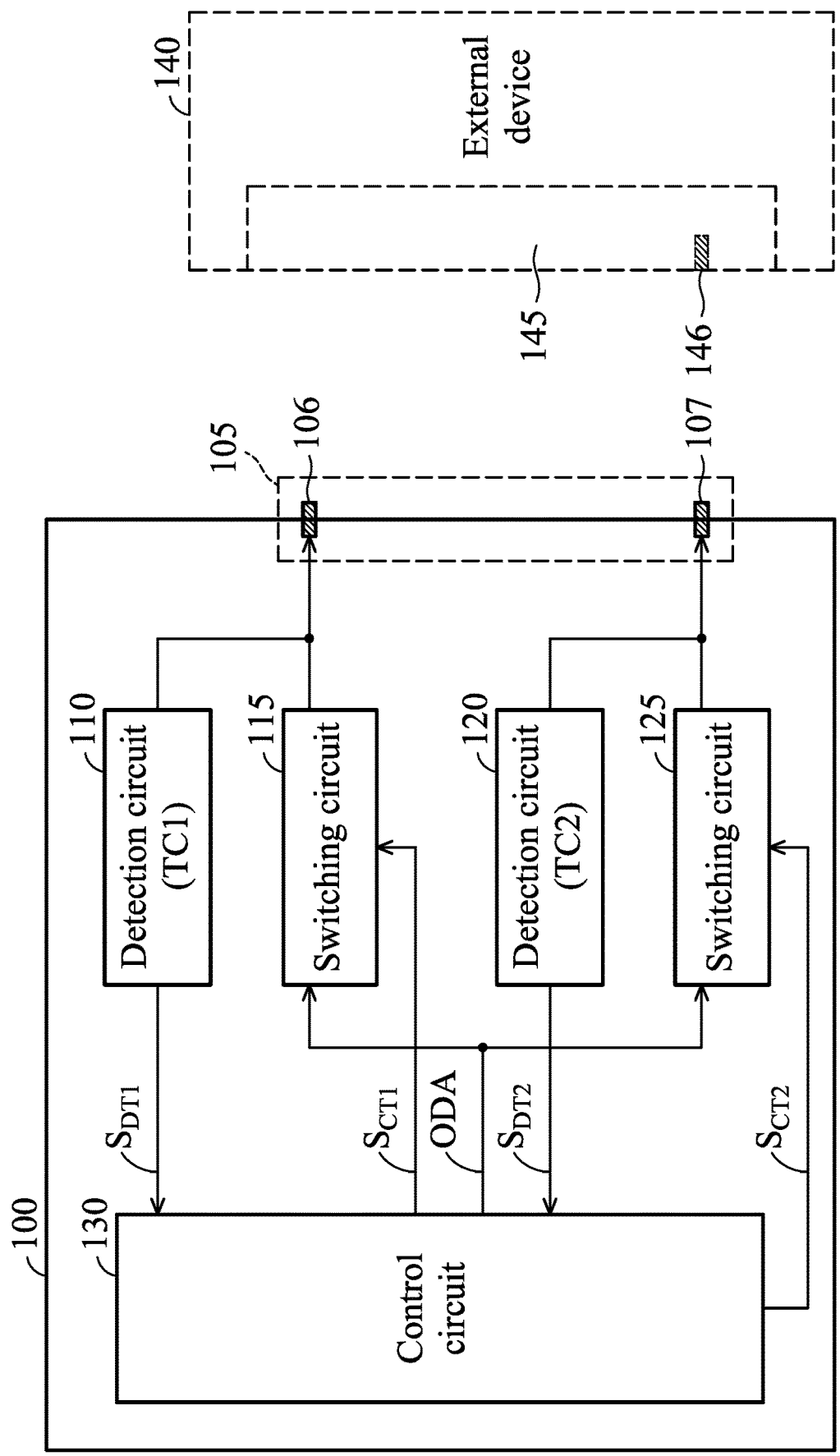
FIG. 1B is a schematic diagram of another exemplary embodiment of the detection control device according to various aspects of the present invention.

FIG. 1A is a schematic diagram of an exemplary embodiment of a detection control device according to various aspects of the present disclosure. The detection control device 100 comprises a USB connection port 105, detection circuits 110 and 120, switching circuits 115 and 125 and a control circuit 130. The USB connection port 105 has transmission pins 106 and 107. In this embodiment, when an external device 140 is normally inserted into the USB connection port 105, the transmission pin 106 is going to electrically connect to a specific pin 146 of the connection port 145 of the external device 140. However, when the external device 140 is reversely inserted into the USB connection port 105, the transmission pin 107 is going to connect to the specific pin 146. As shown in FIG. 1A, the external device 140 is normally inserted into the USB connection port 105. In FIG. 1B, the external device 140 is reversely inserted into the USB connection port 105. In one embodiment, the USB connection port 105 is a Type-C connection port. In this case, the transmission pin 106 is the differential signal terminal TX1+ of the Type-C connection port and the transmission pin 107 is the differential signal terminal TX2+ of the Type-C connection port.

The detection circuit 110 is coupled to the transmission pin 106 and has a time constant TC1. In this embodiment, when the transmission pin 106 does not connect to the specific pin 146, the time constant TC1 is equal to a predetermined value. When the transmission pin 106 is electrically connected to the specific pin 146, the time constant TC1 is not equal to the predetermined value. In this embodiment, the detection circuit 110 generates a detection signal $S_{DT1}$ according to the time constant TC1. In one embodiment, the detection circuit 110 compares the time constant TC1 with the predetermined value. When the time constant TC1 is equal to the predetermined value, the detection circuit 110 sets the detection signal $S_{DT1}$ at a first electrical level, such as a low electrical level. When the time constant TC1 is not equal to the predetermined value, the detection circuit 110 sets the detection signal $S_{DT1}$ at a second electrical level, such as a high electrical level. In other embodiment, the detection circuit 110 uses the time constant TC1 as the detection signal $S_{DT1}$.

The circuit structure of the detection circuit 110 is not limited in the present disclosure. In one embodiment, the detection circuit 110 comprises a first resistor-capacitor (RC) circuit. The first RC circuit (not shown) has a first time constant. In this case, when the transmission pin 106 is not electrically coupled to the specific pin 146, the time at which a first capacitor disposed in the first RC circuit is charged to a predetermined voltage is equal to a first time. However, when the transmission pin 106 is electrically coupled to the specific pin 146, the time at which the first capacitor has changed to the predetermined voltage is equal to a second time. In one embodiment, the first time is less than the second time.

The detection circuit 120 is coupled to the transmission pin 107 and has a time constant TC2. In this embodiment, when the transmission pin 107 is not electrically connected to the specific pin 146, the time constant TC2 is equal to a predetermined value. When the transmission pin 107 is electrically coupled to the specific pin 146, the time constant TC2 is not equal to the predetermined value. The detection circuit 120 generates a detection signal $S_{DT2}$ according to the time constant TC2. In one embodiment, the detection circuit 120 uses the time constant TC2 as the detection signal $S_{DT2}$ and provides the detection signal $S_{DT2}$ to the control circuit 130.

The circuit structure of the detection circuit 120 is not limited in the present disclosure. In one embodiment, the detection circuit 120 comprises a second resistor-capacitor (RC) circuit. The second RC circuit (not shown) has a second time constant. In this case, when the transmission pin 107 is not electrically coupled to the specific pin 146, the time at which a second capacitor disposed in the second RC circuit is charged to a predetermined voltage is equal to a third time. However, when the transmission pin 107 is electrically coupled to the specific pin 146, the time at which the second capacitor has changed to the predetermined voltage is equal to a fourth time. In one embodiment, the third time is less than the fourth time. In this embodiment, the first time is equal to the third time and the second time is equal to the fourth time.

The switching circuit 115 is coupled between the control circuit 130 and the transmission pin 106 and determines whether to communicate with an external device via the transmission pin 106 according to a control signal $S_{CT1}$. The switching circuit 125 is coupled between the control circuit 130 and the transmission pin 107 and determines whether to communicate with an external device via the transmission pin 107 according to a control signal $S_{CT2}$.

The control circuit 130 generates the control signals $S_{CT1}$ and $S_{CT2}$ according to the detection signals $S_{DT1}$ and $S_{DT2}$. In one embodiment, when the transmission pin 106 is coupled to the specific pin 146, the control circuit 130 asserts the control signal $S_{CT1}$ to turn on the switching circuit 115. When the transmission pin 107 is coupled to the specific pin 146, the control circuit 130 asserts the control signal $S_{CT2}$ to turn on the switching circuit 125. In this embodiment, the control circuit 130 further provides output data ODA to the switching circuits 115 and 125.

When the switching circuit 115 is turned on, the switching circuit 115 transmits the output data ODA to the specific pin 146 via the transmission pin 106. However, when the control signal $S_{CT1}$ is not asserted, the switching circuit 115 is turned off. Therefore, the transmission pin 106 stops transmitting the output data ODA to the specific pin 146. Similarly, when the switching circuit 125 is turned on, the switching circuit 125 transmits the output data ODA to the specific pin 146 via the transmission pin 107. However, when the control signal $S_{CT2}$ is not asserted, the switching circuit 125 is turned off. Therefore, the transmission pin 107 stops transmitting the output data ODA to the specific pin 146.

Figure 2:
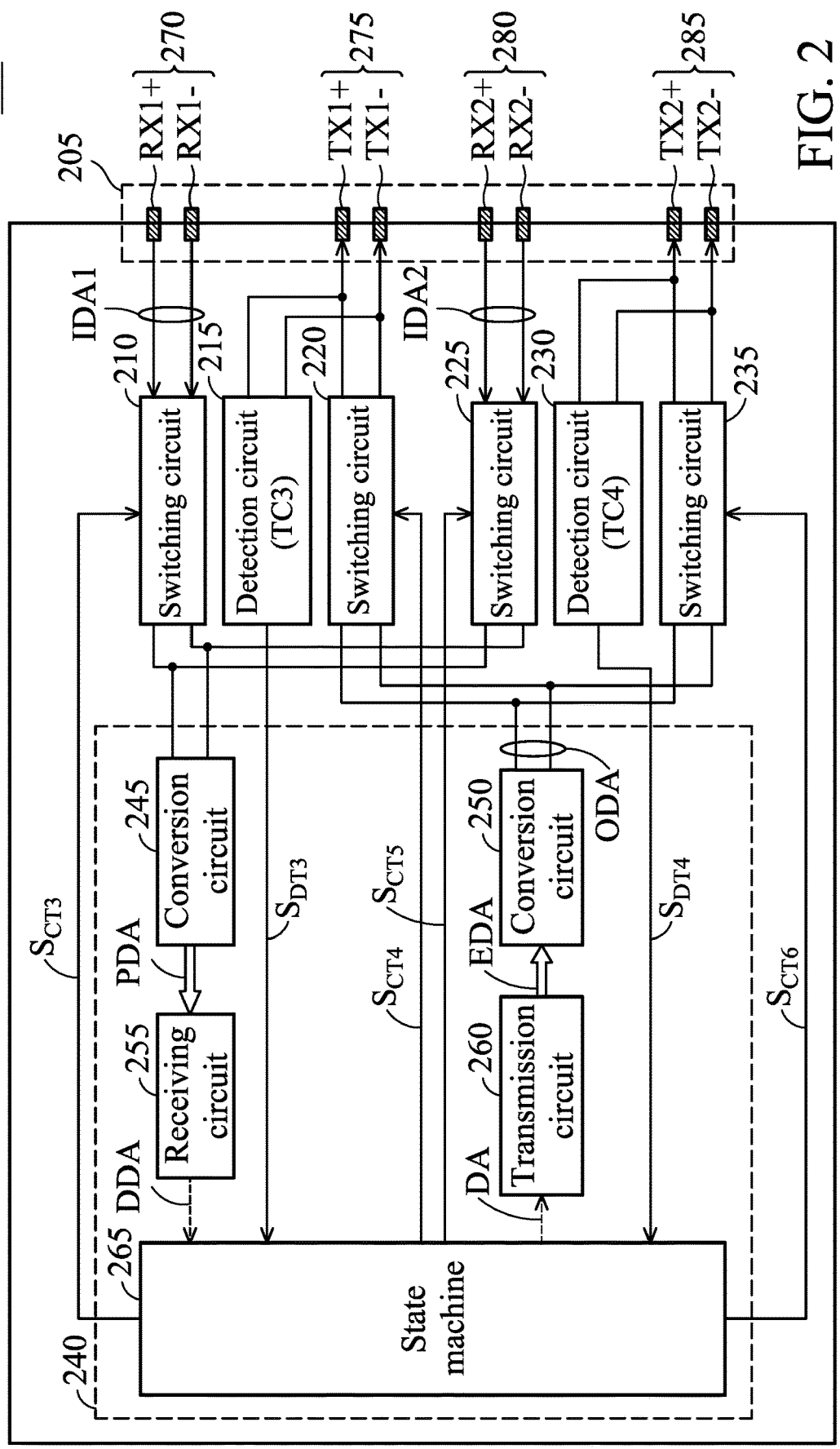
FIG. 2 is a schematic diagram of another exemplary embodiment of the detection control device according to various aspects of the present invention.

FIG. 2 is a schematic diagram of another exemplary embodiment of the detection control device according to various aspects of the present disclosure. The detection control device 200 comprises a USB connection port 205, switching circuits 210, 220, 225, and 235, detection circuits 215 and 230 and a control circuit 240. In this embodiment, the USB connection port 205 is a Type-C connection port comprising pin groups 270, 275, 280 and 285. In one embodiment, the pin group 270 comprises the differential signal terminals RX1+ and RX1−. The pin group 275 comprises the differential signal terminals TX1+ and TX1−. The pin group 280 comprises the differential signal terminals RX2+ and RX2−. The pin group 285 comprises the differential signal terminals TX2+ and TX2−. The pin group 275 is referred to as a first pin group. The pin group 285 is referred to as a second pin group. The pin group 270 is referred to as a third pin group. The pin group 280 is referred to as a fourth pin group.

When the USB connection port disposed in an external device (not shown) is normally inserted into the USB connection port 205, the differential signal terminal RX1+ of the USB connection port 205 is coupled to the differential signal terminal TX1+ of the USB connection port disposed in the external device and the differential signal terminal RX1− of the USB connection port 205 is coupled to the differential signal terminal TX1− of the USB connection port disposed in the external device. In this case, the differential signal terminal TX1+ of the USB connection port 205 is coupled to the differential signal terminal RX1+ of the USB connection port disposed in the external device and the differential signal terminal TX1− of the USB connection port 205 is coupled to the differential signal terminal RX1− of the USB connection port disposed in the external device. However, when the USB connection port disposed in an external device is reversely inserted into the USB connection port 205, the differential signal terminal RX2+ of the USB connection port 205 is coupled to the differential signal terminal TX1+ of the USB connection port disposed in the external device and the differential signal terminal RX2− of the USB connection port 205 is coupled to the differential signal terminal TX1− of the USB connection port disposed in the external device. In such cases, the differential signal terminal TX2+ of the USB connection port 205 is coupled to the differential signal terminal RX1+ of the USB connection port disposed in the external device and the differential signal terminal TX2− of the USB connection port 205 is coupled to the differential signal terminal RX1− of the USB connection port disposed in the external device.

The switching circuit 210 determines whether to communicate with an external device via the pin group 270 according to the control signal $S_{CT3}$. The switching circuit 210 is referred to as a third switching circuit. The switching circuit 220 determines whether to communicate with an external device via the pin group 275 according to the control signal $S_{CT4}$. The switching circuit 220 is referred to as a first switching circuit. The switching circuit 225 determines whether to communicate with an external device via the pin group 280 according to the control signal $S_{CT5}$. The switching circuit 225 is referred to as a fourth switching circuit. The switching circuit 235 determines whether to communicate with an external device via the pin group 285 according to the control signal $S_{CT6}$. The switching circuit 235 is referred to as a second switching circuit.

The detection circuit 215 is coupled to the pin group 275 and has a time constant TC3. The detection circuit 215 is referred to as a first detection circuit. In this embodiment, the detection circuit 215 generates a detection signal $S_{DT3}$ according to the time constant TC3. For example, when the pin group 275 is not electrically coupled to an external device, the time constant TC3 is equal to a first predetermined value. When the pin group 275 is electrically coupled to the external device, the time constant TC3 is not equal to the first predetermined value. Therefore, when the detection circuit 215 generates the detection signal $S_{DT3}$ according to the time constant TC3, the control circuit 240 is capable of determining whether the pin group 275 is coupled to an external device according to the detection signal $S_{DT3}$. In one embodiment, the detection circuit 215 uses the time constant TC3 as the detection signal $S_{DT3}$ and provides the detection signal $S_{DT3}$ to the control circuit 240. The invention does not limit the circuit structure of the detection circuit 215. In one embodiment, the detection circuit 215 comprises a first RC circuit.

The detection circuit 230 is coupled to the pin group 285 and has a time constant TC4. The detection circuit 230 is referred to as a second detection circuit. In this embodiment, the detection circuit 230 generates a detection signal $S_{DT4}$ according to the time constant TC4. For example, when the pin group 285 is not electrically coupled to an external device, the time constant TC4 is equal to a second predetermined value. When the pin group 285 is electrically coupled to an external device, the time constant TC4 is not equal to the second predetermined value. In this case, the detection circuit 230 compares the time constant TC4 and the second predetermined value to generate the detection signal $S_{DT4}$. In other embodiments, the detection circuit 230 uses the time constant TC4 as the detection signal $S_{DT4}$ and provides the detection signal $S_{DT4}$ to the control circuit 240. The circuit structure of the detection circuit 230 is not limited in the present disclosure. In one embodiment, the detection circuit 230 comprises a second RC circuit.

The control circuit 240 generates the control signals $S_{CT3} \sim S_{CT6}$ according to the detection signals $S_{DT3}$ and $S_{DT4}$. When the control circuit 240 recognizes that the pin group 275 is coupled to an external device according to the detection signal $S_{DT3}$, the control circuit 240 turns on the switching circuits 210 and 220 according to the control signals $S_{CT3}$ and $S_{CT4}$. In such cases, output data ODA generated by the control circuit 240 is transmitted to the external device via at least one of the differential signal terminals of the pin group 275 and at least one specific pin of the external device. In other embodiment, the control circuit 240 receives input data IDA1 via at least one of the differential signal terminals of the pin group 270 and at least one specific pin of the external device. In one embodiment, the output data ODA transmitted by the switching circuit 220 is referred to as first output data, and the input data IDA1 is referred to as first input data.

In addition, when the control circuit 240 obtains that the pin group 285 is coupled to an external device according to the detection signal $S_{DT4}$, the control circuit 240 generates the control signals $S_{CT5}$ and $S_{CT6}$ to turn on the switching circuits 225 and 235. In one embodiment, output data ODA generated by the control circuit 240 is transmitted to the external device via at least one of the differential signal terminals of the pin group 285 and at least one specific pin of the external device. In other embodiment, the control circuit 240 receives input data IDA2 via at least one of the differential signal terminals of the pin group 280 and at least one specific pin of the external device. In one embodiment, the output data ODA transmitted by the switching circuit 235 is referred to as second output data, and the input data IDA2 is referred to as second input data.

In some embodiments, the control signal $S_{CT3}$ is the same as the control signal $S_{CT4}$, and the control signal $S_{CT5}$ is the same as the control signal $S_{CT6}$. Therefore, the switching circuits 210 and 220 are simultaneously turned on and the switching circuits 225 and 235 are simultaneously turned on. However, when the switching circuit 210 is turned on, the switching circuit 225 is turned off. When the switching circuit 225 is turned on, the switching circuit 210 is turned off. Similarly, when the switching circuit 220 is turned on, the switching circuit 235 is turned off. When the switching circuit 235 is turned on, the switching circuit 220 is turned off.

In one embodiment, the control circuit 240 comprises a conversion circuit 250, a transmission circuit 260 and a state machine 265. The state machine 265 generates the control signals $S_{CT3} \sim S_{CT6}$ according to the detection signals $S_{DT3}$ and $S_{DT4}$. The transmission circuit 260 outputs encoded data EDA to the conversion circuit 250. In one embodiment, the conversion circuit 250 is a parallel-to-serial converter. The conversion circuit 250 converts the encoded data EDA to the output data ODA, wherein the encoded data EDA is parallel data and the output data ODA is serial data. When the switching circuit 220 is turned on, the switching circuit 220 provides the output data ODA to an external device via at least one of the differential signal terminals of the pin group 275. When the switching circuit 235 is turned on, the switching circuit 235 provides the output data ODA to an external device via at least one of the differential signal terminals of the pin group 285. In one embodiment, the output data ODA can be a differential signal.

In one embodiment, the state machine 265 provides data DA to the transmission circuit 260. In this case, the transmission circuit 260 performs an encode procedure for the data DA to generate encoded data EDA. In another embodiment, the data DA can be provided by a second external device which is coupled to the detection control device 200 via another connection port.

In this embodiment, the control circuit 240 further comprises a conversion circuit 245 and a receiving circuit 255. In one embodiment, the conversion circuit 245 is a serial-to-parallel converter configured to convert the input data IDA1 provided by the switching circuit 210 or the input data IDA2 provided by the switching circuit 225 from serial to parallel such that converted data PDA is generated. The receiving circuit 255 receives and decodes the converted data PDA to generate decoded data DDA. In one embodiment, the receiving circuit 255 provides the decoded data DDA to the state machine 265 or outputs the decoded data to a second external device which is different from the external device coupled to the USB connection port 205.

Figure 3C:
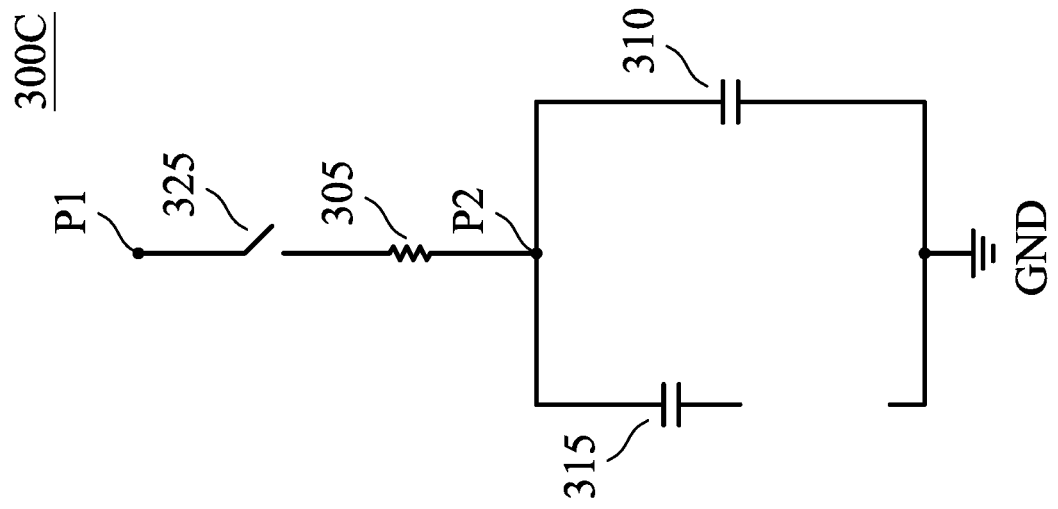
FIG. 3C is a schematic diagram of another exemplary embodiment of the detection circuit according to various aspects of the present invention.
Figure 3B:
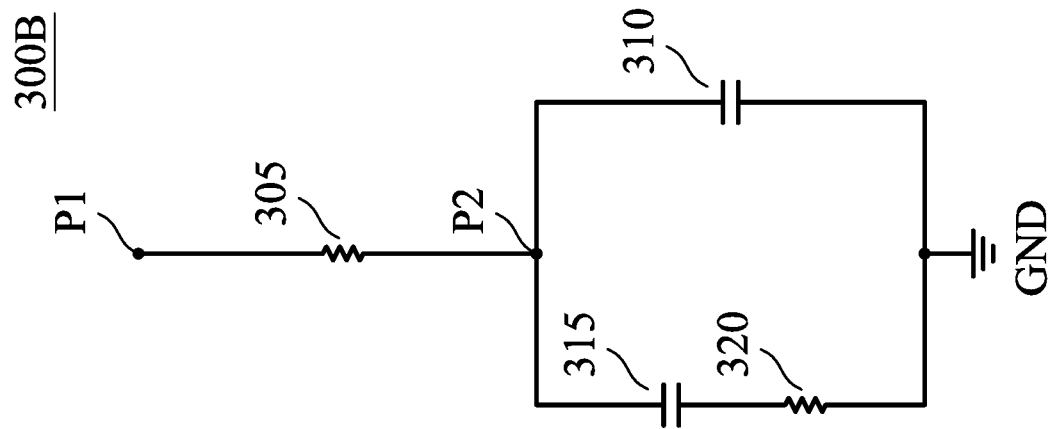
FIG. 3B is a schematic diagram of another exemplary embodiment of the detection circuit according to various aspects of the present invention.
Figure 3A:
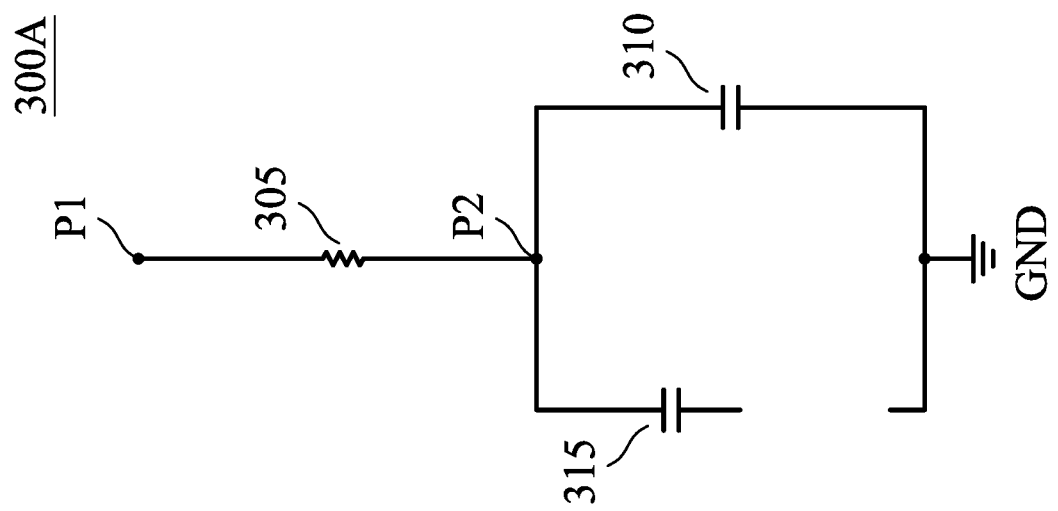
FIG. 3A is a schematic diagram of an exemplary embodiment of a detection circuit according to various aspects of the present invention.

FIG. 3A is a schematic diagram of an exemplary embodiment of a detection circuit according to various aspects of the present disclosure. The detection circuit 300A at least comprises a resistor 305 and capacitors 310 and 315. In one embodiment, the detection circuit 300A is provided as the detection circuit 110 shown in FIG. 1A or the detection circuit 215 shown in FIG. 2. As shown in FIG. 3A, the resistor 305 is coupled between the nodes P1 and P2. The capacitor 310 is coupled between the node P2 and a ground node GND. The capacitor 315 is coupled to the node P2.

Using FIG. 1A as an example, when the specific pin 146 is not coupled to the transmission pin 106, the capacitor 315 does not been coupled to the ground node GND. Therefore, when the node P1 receives a charging voltage, the capacitor 310 is charged according to the charging voltage. In such cases, the voltage of the capacitor 310 is gradually increased. When the capacitor 310 is filled, the electrical level of the node P1 is equal to a first predetermined value. Assume that the time at which the electrical level of the node P1 arrives at the first predetermined value is referred to as the first time.

Refer to FIG. 3B. When the specific pin 146 is coupled to the transmission pin 106, the specific resistor 320 disposed in the external device is coupled between the capacitor 315 and the ground node GND. Therefore, when the node P1 receives a charging voltage, the capacitors 310 and 315 are charged according to the charging voltage. In this case, the voltages of the capacitors 310 and 315 are gradually increased. When the capacitors 310 and 315 are filled, the electrical level of the node P1 is equal to the first predetermined value. In such cases, the time when the electrical level of the node P1 arrives at the first predetermined value is referred to as the second time. In one embodiment, since the capacitor 310 is connected to the capacitor 315 in parallel, the second time is longer than the first time. In this case, the control circuit 130 generates the control signal $S_{CT1}$ according to the time when the electrical level of the node P1 arrives at the first predetermined value.

FIG. 3C is a schematic diagram of another exemplary embodiment of the detection circuit according to various aspects of the present disclosure. FIG. 3C is similar to FIG. 3A except that the detection circuit 300C shown in FIG. 3C further comprises a switch 325. The switch 325 may be opened or closed. The switch 325 is coupled between the node P1 and the resistor 305. In this case, the switch 325 may be in an opened state or in a closed state, depending on the switching signal. In one embodiment, the switching signal is generated by a controller (not shown). For example, the switching signal is generated by a basic input/output system (BIOS). When the detection control device 100 does not need to determine whether the USB connection port 105 is coupled to the external device 140, the controller does not turn on the switch 325. The switch 325 is in an opened state. However, when the detection control device 100 needs to determine whether the USB connection port 105 is coupled to the external device 140, the controller turns on the switch 325. The switch 325 is in a closed state. In other embodiments, the detection circuit 300C is capable of serving as the detection circuit 110 in FIG. 1A or the detection circuit 215 in FIG. 2.

Figure 4C:
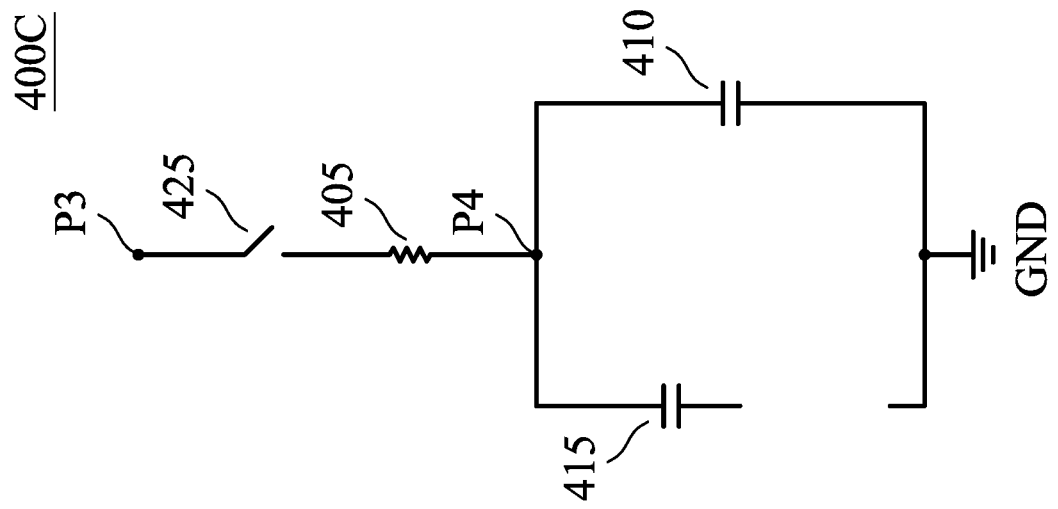
FIG. 4C is a schematic diagram of another exemplary embodiment of the detection circuit according to various aspects of the present invention.
Figure 4B:
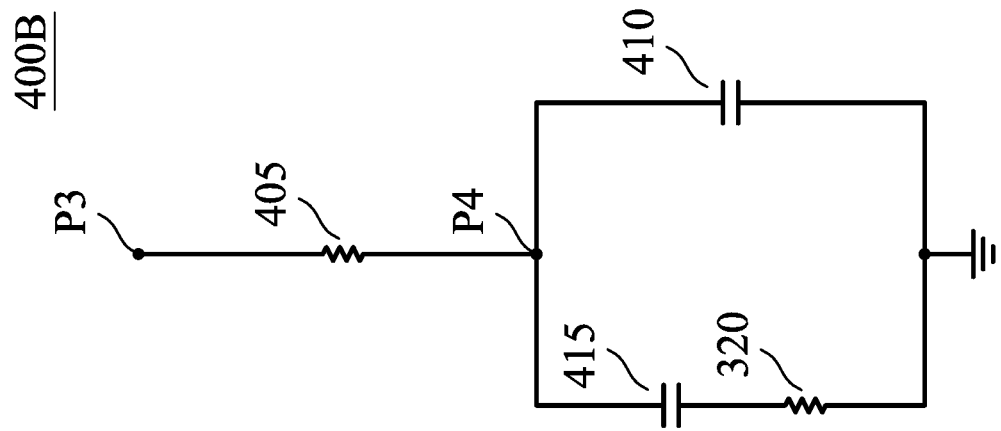
FIG. 4B is a schematic diagram of another exemplary embodiment of the detection circuit according to various aspects of the present invention.
Figure 4A:
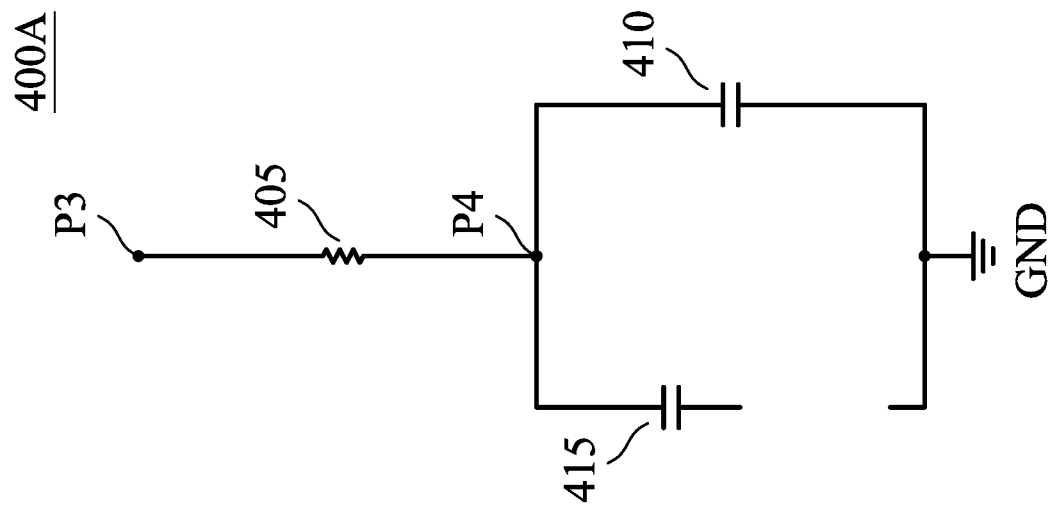
FIG. 4A is a schematic diagram of another exemplary embodiment of the detection circuit according to various aspects of the present invention.

FIG. 4A is a schematic diagram of another exemplary embodiment of the detection circuit according to various aspects of the present disclosure. The detection circuit 400A at least comprises a resistor 405 and capacitors 410 and 415. In one embodiment, the detection circuit 400A is capable of serving as the detection circuit 120 shown in FIG. 1A or the detection circuit 230 shown in FIG. 2. As shown in FIG. 4A, the resistor 405 is coupled between the nodes P3 and P4. The capacitor 410 is coupled between the node P4 and the ground node GND. The capacitor 415 is coupled to the node P4.

Using FIG. 1A as an example, when the specific pin 146 is not coupled to the transmission pin 107, the capacitor 415 does not couple to the ground node GND. When the node P3 receives a charging voltage, the capacitor 410 is charged according to the charging voltage. Therefore, the voltage of the capacitor 410 is gradually increased. When the capacitor 410 is filled, the electrical level of the node P3 is equal to a second predetermined value. In this case, assume that the time when the electrical level of the node P3 arrives at the second predetermined value is referred to as the third time.

Refer to FIG. 4B. When the specific pin 146 has been coupled to the transmission pin 107, a specific resistor 320 disposed in the external device is coupled between the capacitor 415 and the ground node GND. Therefore, when the node P3 receives a charging voltage, the capacitors 410 and 415 are charged according to the charging voltage. The voltages of the capacitors 410 and 415 are gradually increased. When the capacitors 410 and 415 are filled, the electrical level of the node P3 arrives at the second predetermined value. In this case, the time when the electrical level of the node P3 arrives at the second predetermined value is referred to as a fourth time. In one embodiment, the fourth time is higher than the third time. In other embodiments, the third time is about equal to the first time and the fourth time is about equal to the second time.

FIG. 4C is a schematic diagram of another exemplary embodiment of the detection circuit according to various aspects of the present disclosure. FIG. 4C is similar to FIG. 4A except that the detection circuit 400C shown in FIG. 4C further comprises a switch 425. The switch 425 may be opened or closed. The switch 425 is coupled between the node P3 and the resistor 405. In such cases, the switch 425 is in an opened state or in a closed state, depending on the switching signal. In one embodiment, the switching signal is generated by a controller (not shown). For example, the switching signal is generated by a BIOS. When the detection control device 100 does not need to determine whether the USB connection port 105 is coupled to the external device 140, the controller does not turn on the switch 425. The switch 425 is in an opened state. However, when the detection control device 100 needs to determine whether the USB connection port 105 is coupled to the external device 140, the controller turns on the switch 425. The switch 425 is in a closed state. In other embodiments, the detection circuit 400C is capable of serving as the detection circuit 120 shown in FIG. 1A or the detection circuit 230 shown in FIG. 2.

Figure 5:
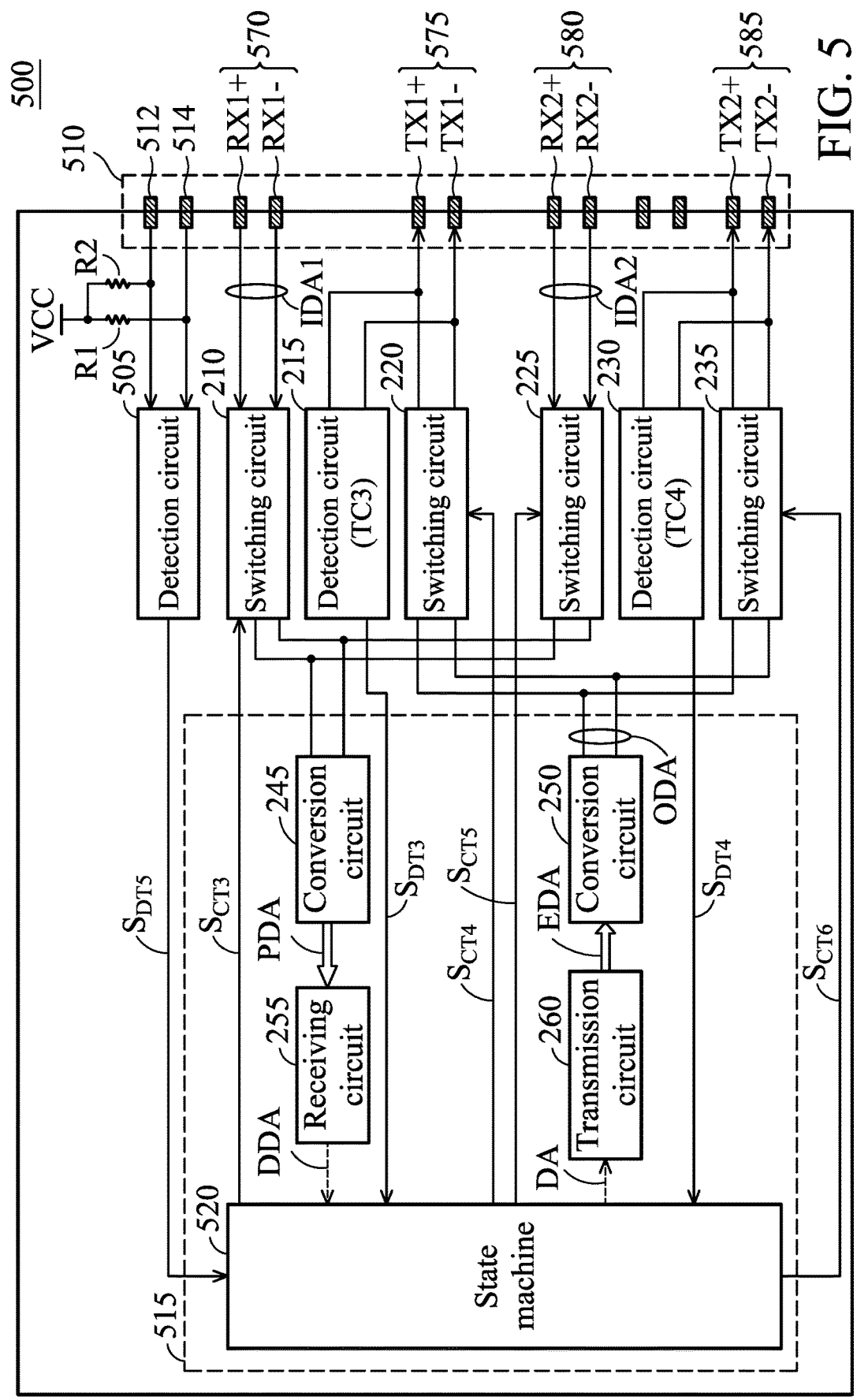
FIG. 5 is a schematic diagram of another exemplary embodiment of the detection control device according to various aspects of the present invention.

FIG. 5 is a schematic diagram of another exemplary embodiment of the detection control device according to various aspects of the present disclosure. FIG. 5 is similar to FIG. 2 except that the detection control device 500 further comprises a detection circuit 505. As shown in FIG. 5, the detection circuit 505 is coupled to the detection pins 512 and 514 of the USB connection port 510 and detects the electrical levels of the detection pins 512 and 514 to generate a detection signal $S_{DT5}$. In one embodiment, the detection pins 512 and 514 are the configuration channel pins (e.g. CC1 and CC2) of the USB Type-C connection port.

The detection pin 512 is coupled to a pull-high resistor R2. The detection pin 514 is coupled to another pull-high resistor R1. Since the pull-high resistors R1 and R2 receive the voltage VCC, the electrical levels of the detection pins 512 and 514 are about equal to the voltage VCC. When the connection port of an external device (not shown) is normally inserted into the USB connection port 510, a pull-low resistor disposed in the external device is coupled to the detection pin 512. Therefore, the electrical level of the detection pin 512 is reduced to a low electrical level lower than the voltage VCC. However, when the connection port of the external device is reversely inserted into the USB connection port 510, the pull-low resistor disposed in the external device is coupled to the detection pin 514. Therefore, the electrical level of the detection pin 514 is reduced to a low electrical level that is lower than the voltage VCC. In this case, the detection circuit 505 generates the detection signal $S_{DT5}$ according to the electrical levels of the detection pins 512 and 514. The control circuit 515 obtains that the external device is normally or reversely inserted into the USB connection port 510 according to the detection signal $S_{DT5}$ and generates the control signals $S_{CT3} \sim S_{CT6}$ according to the detection signal $S_{DT5}$ to communicate with the external device via at least one of the pin groups 570, 575, 580 and 585.

In one embodiment, the state machine 520 generates the control signals $S_{CT3} \sim S_{CT6}$ according to the detection signals $S_{DT3} \sim S_{DT5}$. Additionally, different external devices comprise different pull-low resistors that have different resistance. Therefore, the control circuit 515 obtains that the kind of external device according to the electrical levels of the detection pins 512 and 514. For example, the external device may be a cable or a peripheral device.

Figure 6:
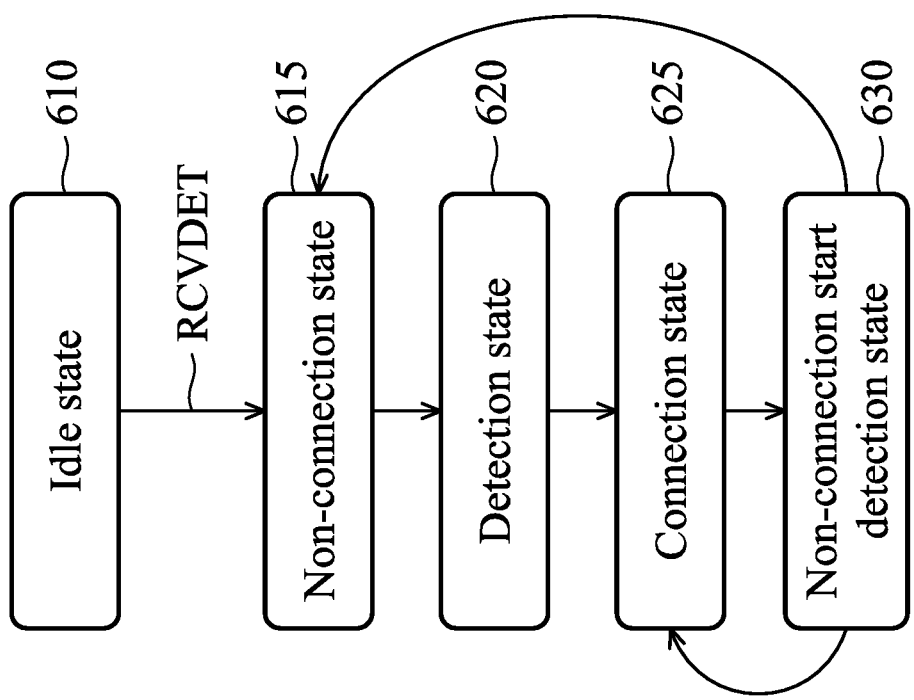
FIG. 6 is a state machine diagram of an exemplary embodiment of a control circuit according to various aspects of the present invention.

FIG. 6 is a state machine diagram of an exemplary embodiment of a control circuit according to various aspects of the present disclosure. For brevity, the control circuit 515 shown in FIG. 5 is given as an example. First, after the control circuit 515 is powered up, the control circuit 515 operates in an idle state 610. The control circuit 515 reads a set value stored in a storage circuit. In one embodiment, the storage circuit is disposed in the control circuit 515. In another embodiment, the set value is set by a BIOS.

When the set value is equal to a first set value RCVDET, the control circuit 515 enters a non-connection state 615. In the non-connection state 615, the control circuit 515 determines whether the time constant TC3 or TC4 has changed. For example, the control circuit 515 determines whether the time constant TC3 is equal to a first predetermined value or determines whether the time constant TC4 is equal to a second predetermined value. When the constant TC3 or TC4 has changed (e.g. the time constant TC3 is not equal to the first predetermined value or the time constant TC4 is not equal to the second predetermined value), the control circuit 515 enters a detection state 620. In the detection state 620, the control circuit 515 determines whether the pin group 575 or 585 is coupled to a specific pin (e.g. RX1+ or RX1−) of an external device. Using the pin group 575 as an example, when the pin group 575 does not couple to the specific pin of the external device, the time constant TC3 is equal to a first time value. When the pin group 575 is coupled to the specific pin of the external device, the time constant TC3 is equal to a second time value. Therefore, the control circuit 515 obtains whether the pin group 575 is coupled to the specific pin of the external device according to the time constant TC3.

When the pin group 575 or 585 is coupled to the specific pin of the external device, the control circuit 515 enters a connection state 625. In the connection state 625, the control circuit 515 outputs data to the external device via the pin group 575 or 585. For example, when the pin group 575 is coupled to an external device, the control circuit 515 output data to the external device via at least one of differential signal terminals of the pin group 575. However, when the pin group 585 is coupled to the specific pin of the external device, the control circuit 515 provides data to the external device via at least one differential signal terminal of the pin group 585.

In the connection state 625, the control circuit 515 determines that the detection control device 500 operates in a standby mode or a sleep mode. In one embodiment, the standby mode is the U3 mode defined in a USB 3.0 protocol and the sleep mode is the U1 or U2 mode defined in the USB 3.0 protocol. When the detection control device 500 operates in the standby mode or the sleep mode, the control circuit 515 enters a non-connection start detection state 630. In the non-connection start detection state 630, once the control circuit 515 operates from the standby mode or the sleep mode to an operation mode (e.g. the U0 mode defined in the USB 3.0 protocol), the control circuit 515 determines whether the time constant TC3 or TC4 has changed again, for example, the control circuit 515 determines whether the time constant TC3 returns to the first predetermined value and determines whether the time constant TC4 returns to the second predetermined value. When the time constant TC3 or TC4 is not changed again (e.g. the time constant TC3 is not equal to the first predetermined value or the time constant TC4 is not equal to the second predetermined value), it means that an external device is still inserted into the USB connection port 510. Therefore, the control circuit 515 enters the connection state 625 again. However, when the time constant TC3 or TC4 has changed again (e.g. the time constant TC3 returns to the first predetermined value or the time constant TC4 returns to the second predetermined value), it means that the external device is removed from the USB connection port 510. Therefore, the control circuit 515 enters the non-connection state 615. In one embodiment, the control circuit 515 determines whether the time constant TC3 or TC4 has changed again (e.g. the time constant TC3 returns to the first predetermined value or the time constant TC4 returns to the second predetermined value) at fixed intervals of time. The control circuit 515 enters the corresponding state according to the time constants TC3 and TC4. For example, the control circuit 515 may enter the non-connection start detection state 630 from the connection state 625 or enter the detection state 620 from the non-connection state 615.

Figure 7:
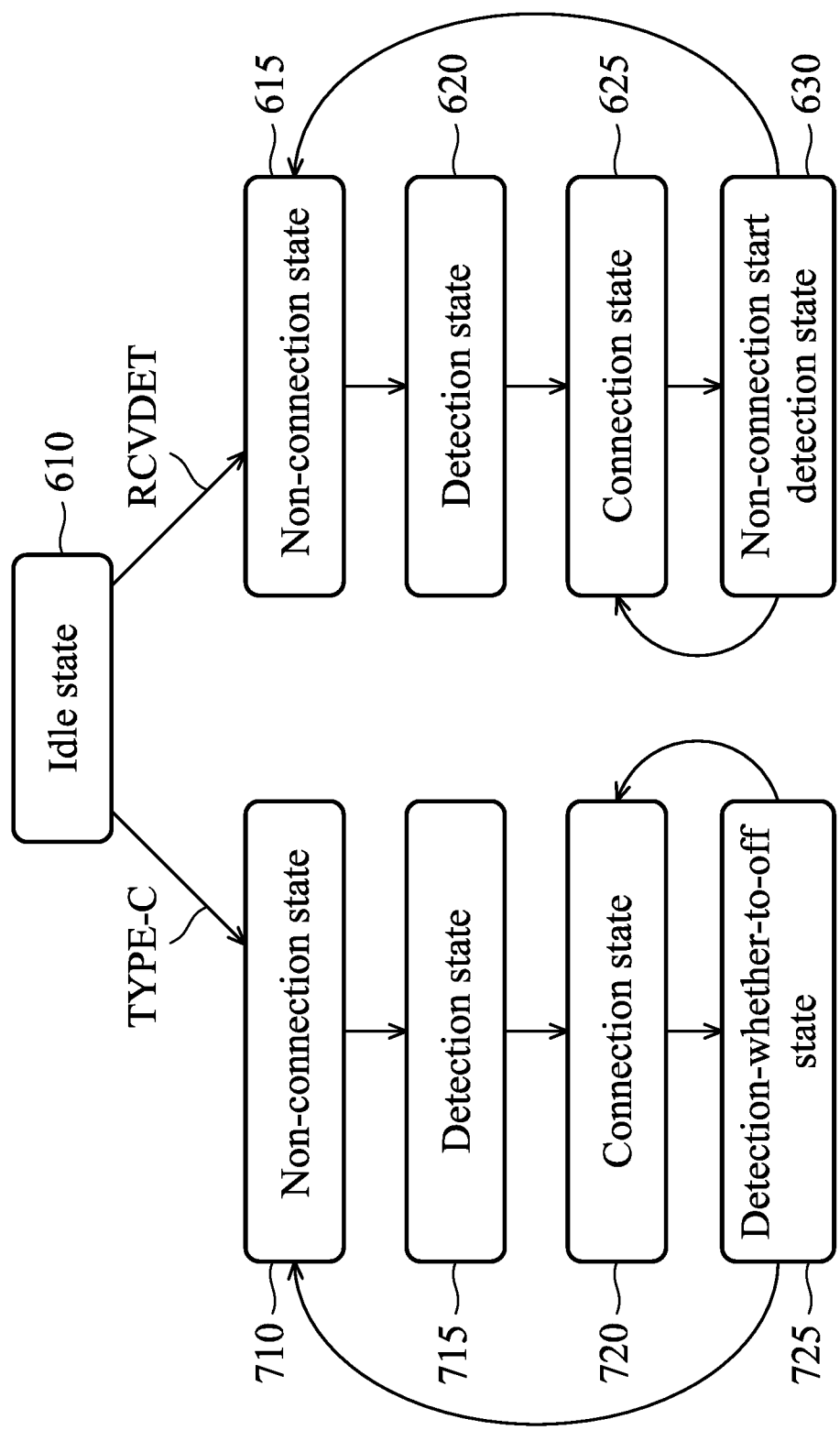
FIG. 7 is a state machine diagram of another exemplary embodiment of the control circuit according to various aspects of the present invention.

FIG. 7 is a state machine diagram of another exemplary embodiment of the control circuit according to various aspects of the present disclosure. FIG. 7 is similar to FIG. 6 except for the addition of states 710, 715, 720 and 725. The control circuit 515 shown in FIG. 5 is given as an example. When the set value is equal to a second set value TYPE-C, the control circuit 515 enters a non-connection state 710. In the non-connection state 710, the control circuit 515 determines the electrical levels of the detection pins 512 and 514.

When the electrical level of the detection pin 512 or 514 has changed (e.g. the electrical level of the detection pin 512 is not equal to a first predetermined electrical level or the electrical level of the detection pin 514 is not equal to a second predetermined electrical level), the control circuit 515 enters a detection state 715. In the detection state 715, when the electrical level of the detection pin 512 is not equal to the first predetermined electrical level or the electrical level of the detection pin 514 is not equal to a second predetermined electrical level, the control circuit 515 determines whether the variation of the electrical level of the detection pin 512 or 514 is a glitch. Using the detection pin 512 as an example, assume that the electrical level of the detection pin 512 has changed, such as from a low electrical level to a high electrical level. In this case, the control circuit 515 determines the duration when the electrical level of the detection pin 512 is the high electrical level. When the duration that the electrical level of the detection pin 512 is the high electrical level does not arrive a first predetermined time, it means that a glitch causes the variation of the electrical level of the detection pin 512. Therefore, the control circuit 515 ignores the variation of electrical level of the detection pin 512 and continuously determines whether the electrical level of the detection pin 512 is not equal to the first predetermined electrical level or determines whether the electrical level of the detection pin 514 is not equal to the second predetermined electrical level.

When the duration that the electrical level of the detection pin 512 is the high electrical level arrives at the first predetermined time, it means that an external device has inserted into the USB connection port 510. Therefore, the control circuit 515 enters a connection state 720. In the connection state 720, the control circuit 515 utilizes the corresponding pin group to receive the input data from the external device and/or provide the output data to the external device. In one embodiment, the control circuit 515 determines whether the electrical level of the detection pin 512 or 514 has changed again (e.g. the electrical level of the detection pin 512 returns to the first predetermined electrical level and the electrical level of the detection pin 514 returns to the second predetermined electrical level) at regular time intervals. When the electrical level of the detection pin 512 or 514 has changed again (e.g. the electrical level of the detection pin 512 returns to the first predetermined electrical level or the electrical level of the detection pin 514 returns to the second predetermined electrical level), it represents that the external device does not insert into the USB connection port 510. Therefore, the control circuit 515 enters a detection-whether-to-off state 725. In the detection-whether-to-off state 725, the control circuit 515 determines whether the external device does not couple to the USB connection port 510 according to the electrical levels of the detection pins 512 and 514. In one embodiment, the control circuit 515 determines whether a glitch causes the variation of the electrical level of the detection pin 512 or 514. Using the detection pin 512 as an example, assume that the electrical level of the detection pin 512 has changed, such as from a electrical high level to a low electrical level. In this case, the control circuit 515 detects the duration that the electrical level of the detection pin 512 is the low electrical level. When the duration that the electrical level of the detection pin 512 is the low electrical level is less than a second predetermined time, it means that a glitch causes the variation of the electrical level of the detection pin 512. Therefore, the control circuit 515 enters the connection state 720. In the connection state 720, the control circuit 515 continuously communicates with the external device and then detects the electrical levels of the detection pins 512 and 514. However, when the duration that the electrical level of the detection pin 512 is the low electrical level is longer than the second predetermined time, it means that the external device is removed. Therefore, the control circuit 515 enters the non-connection state 710.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A detection control device comprising:
   a USB connection port comprising a first pin group and a second pin group;
   a first detection circuit, having a first time constant, wherein responsive to the first pin group coupling to an external device, the first detection circuit generates a first detection signal according to the first time constant;
   a second detection circuit, having a second time constant, wherein responsive to the second pin group coupling to the external device, the second detection circuit generates a second detection signal according to the second time constant;
   a control circuit, generating a first control signal and a second control signal according to the first and second detection signals;
   a first switching circuit, determining whether to communicate with the external device via the first pin group according to the first control signal; and
   a second switching circuit, determining whether to communicate with the external device via the second pin group according to the second control signal.

2. The detection control device as claimed in claim 1, wherein the USB connection port is a Type-C connection port, the Type-C connection port comprises a first differential signal terminal, a second differential signal terminal, a third differential signal terminal and a fourth differential signal terminal, and
   wherein the first pin group comprises the first and second differential signal terminals, and the second pin group comprises the third and fourth differential signal terminals.

3. The detection control device as claimed in claim 1, wherein the first switching circuit is coupled to the first pin group and the second switching circuit is coupled to the second pin group.

4. The detection control device as claimed in claim 1, further comprising:
   a third switching circuit coupled to a third pin group of the USB connection port and receiving first input data provided by the external device via the third pin group; and a fourth switching circuit coupled to a fourth pin group of the USB connection port and receiving second input data provided by the external device via the fourth pin group.

5. The detection control device as claimed in claim 4, wherein the third switching circuit transmits the first input data to the control circuit according to the first control signal, and the fourth switching circuit transmits the second input data to the control circuit according to the second control signal.

6. The detection control device as claimed in claim 4, wherein the first and second input data are differential signals.

7. The detection control device as claimed in claim 4, wherein the control circuit comprises:
 a state machine, generating the first and second control signals according to the first and second detection signals;
 a transmission circuit, configured to provide encoded data;
 a first conversion circuit, converting the format of the encoded data into a serial format to generate output data and providing the output data to the first and second switching circuits;
 a second conversion circuit, coupled to the third and fourth switching circuits and converting the format of the first or second input data into a parallel format to generate converted data; and
 a receiving circuit, decoding the converted data to generate decoded data to the state machine.

8. The detection control device as claimed in claim 1, wherein the first detection circuit comprises:
 a first resistor, coupled between a first node and a second node;
 a first capacitor, coupled between the second node and a ground node;
 a second capacitor, coupled to the second node, wherein responsive to the external device coupling to the first pin group, a specific resistor disposed in the external device is configured to couple between the second capacitor and the ground node.

9. The detection control device as claimed in claim 8, wherein the second detection circuit comprises:
 a second resistor, coupled between a third node and a fourth node;
 a third capacitor, coupled between the fourth node and the ground node;
 a fourth capacitor, coupled to the fourth node, wherein responsive to the external device coupling to the second pin group, the specific resistor is configured to couple between the fourth capacitor and the ground node.

10. The detection control device as claimed in claim 9, further comprising:
 a first switch, coupled between the first node and the first resistor; and
 a second switch, coupled between the third node and the second resistor, wherein the control circuit determines the first or second switch to be in an opened state or a closed state.

11. The detection control device as claimed in claim 1, wherein the control circuit determines whether the first or second time constant has changed at fixed intervals of time to generate a determination result and determines whether to interrupt communication between the detection control device and the external device.

12. The detection control device as claimed in claim 1, further comprising:
 a storage circuit, storing a set value, wherein responsive to the set value being equal to a first predetermined value, the control circuit enters a non-connection state;
 wherein in the non-connection state, the control circuit determines whether the first pin group is coupled to the external device, and responsive to the first pin group coupling to the external device, the control circuit enters a connection state;
 wherein in the connection state, the control circuit provides output data to the external device via the first pin group.

13. The detection control device as claimed in claim 12, wherein in the connection state, responsive to the detection control device entering a standby mode or a sleep mode, the control circuit enters a non-connection start detection state.

14. The detection control device as claimed in claim 13, wherein in the non-connection start detection state, responsive to the external device not coupling to the first and second pin groups, the control circuit enters the non-connection state.

15. The detection control device as claimed in claim 13, wherein in the non-connection start detection state, responsive to the detection control device entering an operation mode from the standby mode or the sleep mode, the control circuit enters the connection state.

16. The detection control device as claimed in claim 13, wherein the control circuit determines whether to enter another state at every fixed time interval.

17. The detection control device as claimed in claim 12, wherein the set value is set by a basic input/output system (BIOS).

18. The detection control device as claimed in claim 1, further comprising:
 a first detection pin, coupled to a first pull-high resistor;
 a second detection pin, coupled to a second pull-high resistor; and
 a third detection circuit, generating a third detection signal according to an electrical level of the first detection pin and an electrical level of the second detection pin, wherein the control circuit generates the first and second control signals according to the third detection signal.

19. The detection control device as claimed in claim 18, further comprising:
 a storage circuit, storing a set value, wherein responsive to the set value being equal to a second predetermined value, the control circuit enters a non-connection state,
 wherein in the non-connection state, the control circuit determines whether the electrical level of the first detection pin has changed, and responsive to the electrical level of the first detection pin changing, the control circuit enters a connection state.

20. The detection control device as claimed in claim 19, wherein responsive to the set value being equal to the second predetermined value, the control circuit entering in the connection state, and the electrical level of the first detection pin changing, the control circuit enters the non-connection state.

* * * * *